Figure 1:
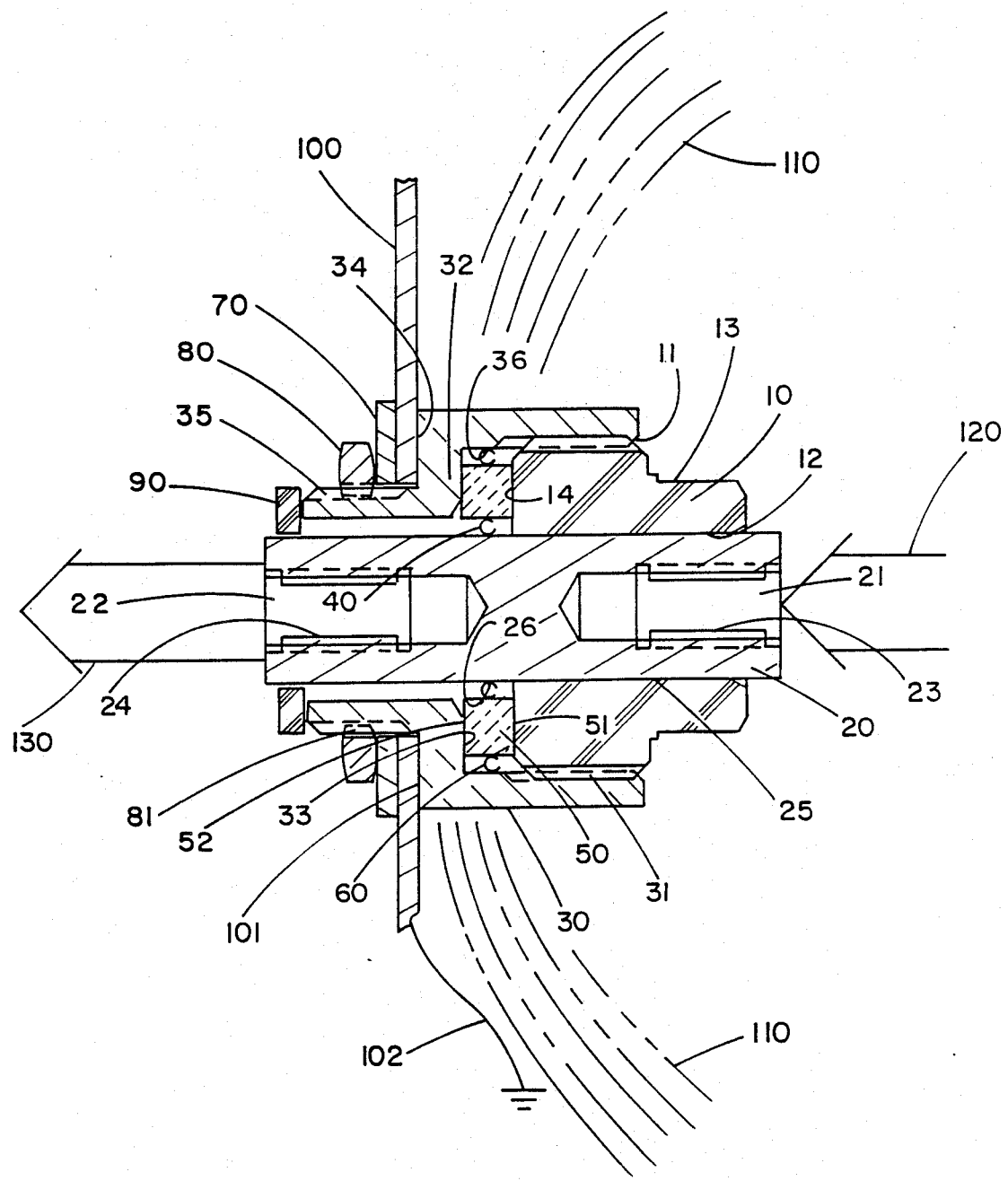

United States Patent [19]

Carlson et al.

[11] Patent Number: 4,935,842

[45] Date of Patent: Jun. 19, 1990

[54] HIGH CURRENT FEED-THROUGH CAPACITOR

[75] Inventors: William E. Carlson, Rockford; Mark W. Metzler, Davis; Lawrence E. Crowe, Lindenwood, all of Ill.

[73] Assignee: Sundstrand Corporation, Rockford, Ill.

[21] Appl. No.: 378,899

[22] Filed: Jul. 12, 1989

[51] Int. Cl.⁵ .......................... H01G 4/42; H03H 7/04
[52] U.S. Cl. ........................................ 361/302; 333/12
[58] Field of Search .................... 361/302; 333/12, 182

[56] References Cited

U.S. PATENT DOCUMENTS

| | | | |
|---|---|---|---|
| 2,756,375 | 7/1956 | Peck | 361/302 |
| 2,922,936 | 1/1960 | Dehn et al. | 361/302 |
| 2,973,490 | 2/1961 | Schlicke | 333/79 |
| 2,983,855 | 5/1961 | Schlicke | 361/302 |
| 2,994,048 | 7/1961 | Schlicke | 333/79 |
| 3,023,383 | 2/1962 | Schlicke | 333/79 |
| 3,243,671 | 3/1966 | Heron, Jr. et al. | 361/302 |
| 3,443,251 | 5/1969 | Garstang et al. | 333/79 |
| 3,842,374 | 11/1974 | Schlicke | 333/79 |
| 4,229,714 | 10/1980 | Yu | 333/12 |
| 4,242,655 | 12/1980 | Carlson et al. | 333/183 |
| 4,314,213 | 2/1982 | Wakino | 333/182 |
| 4,700,155 | 10/1987 | Sakamoto et al. | 333/182 |
| 4,749,972 | 6/1988 | Schulz et al. | 333/167 |

FOREIGN PATENT DOCUMENTS 741019 8/1953 United Kingdom .
943571 1/1962 United Kingdom .

*Primary Examiner*—Donald A. Griffin
*Attorney, Agent, or Firm*—David H. Hitt

[57] ABSTRACT

A compact, lightweight, high current, feed-through capacitor for variable speed constant frequency aircraft power systems to provide filtering for unwanted higher harmonics and electromagnetic interference produced by the systems which provides a high temperature, high current feed-through capacitor having a hollow conductive housing, a conductive feed-through stud within the housing, an annular capacitive element for conducting electrical energy, and an electrical coupling, comprising a first conductor composed between an outer surface of the stud and an inner surface of the capacitive element, the first conductor providing an electrical path from the stud to the capacitive element for electrical energy present in the stud and a second conductor disposed radially between an outer surface of the capacitive element and an inner surface of the housing, the second conductor providing an electrical path for the electrical energy conducted by the capacitive element from the stud. The housing is coupled to an electrical ground to provide dissipation. The capacitive element has electrode coatings on its inner and outer surfaces to conduct electrical energy thereto and therefrom. The first and second conductors bear resiliently against the electrode coatings to suspend the capacitive element between the feed-through stud and the housing, thereby allowing the housing, the capacitive element and the stud to shift relative to one another as the temperature of the feed-through capacitor changes, whereby mechanical stress which would be placed on the capacitive element absent the first and second conductors is dissipated.

34 Claims, 2 Drawing Sheets

HIGH CURRENT FEED-THROUGH CAPACITOR

TECHNICAL FIELD

This invention relates to a high current feed-through capacitor of the type useful for filtering electromagnetic interference produced by high power electrical generating systems such as variable speed constant frequency (VSCF) aircraft power generating systems in a preferred embodiment.

BACKGROUND ART

A variable speed constant frequency aircraft power generating system is a solid state device which converts wild frequency AC power produced by a generator driven at variable speed into constant frequency AC power useful for powering electrical systems on board the aircraft. VSCF systems employ, among other things, large switching power transistors as a part of an inverter to convert DC power into constant frequency AC power. By-products of the transistors' operation are unwanted higher harmonics and electromagnetic interference ("EMI"). EMI is higher harmonics usually defined to be equal to or exceeding the 200th harmonic of the fundamental. It is desired to suppress these higher harmonics and EMI. The instant invention provides a compact, lightweight and inexpensive solution to the problem of attenuating higher harmonics and EMI produced in a VSCF system.

In typical VSCF systems, solid state components are housed within electrical chasses. These chasses act as an electrical shield, preventing EMI produced and existing within the chasses from leaving therefrom. However, electrical leads enter and exit the chasses, carrying through them the EMI, thereby defeating the shielding provided by the chasses. It is desired to provide a means in the form of an electrical passageway through the chasses in order to allow fundamental frequency electrical power to enter and exit the chasses without carrying with it the undesirable higher harmonics and EMI.

This desired function usually takes the form of a feed-through capacitor. A feed-through capacitor comprises a conductive shaft or stud that passes through a chassis wall. A capacitive element usually surrounds the stud and is coupled to the stud and the chassis wall on the inside of the chassis The capacitive element provides a low impedance path from the stud to the chassis wall for higher harmonics and EMI. The capacitive element appears as an insulator to low frequencies on the stud and therefore does not divert the low frequencies from the stud to the housing. These low frequencies are allowed to pass through the chassis wall unattenuated.

It is common to find feed-through capacitors used in low power radio frequency ("RF") applications, where the fundamental frequency is in a radio frequency range and EMI appears as interference of a frequency many times that of the fundamental. Also, in RF applications, the current at the fundamental frequency is far below one ampere. Following is a discussion of examples of RF attenuating feed-through capacitors and related devices that define the background art to which the invention to be described is an improvement.

U.S. Pat. No. 4,229,714, which issued on Oct. 21, 1980 to Yu, is directed to an RF coaxial connector assembly, having an inner and outer conductor, which employs a washer-like capacitor fitted over the outer conductor for low frequency isolation and which employs a transformer adapted for connection between a source of RF signals and the inner and outer conductors of the assembly for reducing the RF currents on the outer conductor. Reduction of the RF currents on the outer conductor is effective to reduce the radiation of RF energy from a coaxial cable coupling the connector assembly to the load. Yu shows resilient conductors supporting the capacitor on its sides. Such an arrangement provides a tortuous path for high frequencies from the outer conductor to a chassis wall.

The present invention is not a coaxial connector assembly, nor is it desired to pass RF signals through the inner conductor. In contrast, the present invention employs resilient rings on inner and outer surfaces of an annular capacitive element to allow comparatively high frequencies to be shunted to the wall of an EMI shielded chassis in as direct a path as possible. In Yu, the inner conductor is not shielded; in the present invention, it is.

U.S. Pat. No. 2,756,375, which issued on July 25, 1956 to Peck, is directed to a feed-through ceramic capacitor employing a metallic casing consisting of a top and a lower depending body portion surrounding a series of metallized ceramic disks which in turn surround a feed-through wire, the entire assembly being sealed in a fixed relationship in which the capacitor element is not subject to tension or shear.

The present invention employs a somewhat different arrangement of capacitor elements to achieve an entirely different object. While Peck is concerned with breaking the capacitive element by bending the feed-through wire, the present invention is concerned with stresses which may damage the capacitive element due to extreme operating temperatures of the device. Accordingly, resilient conductive rings are employed within the present invention to allow for these thermal stresses to be dissipated.

U.S. Pat. No.4,314,213, which issued on Feb. 2, 1982 to Wakino, is directed to an improved through-type capacitor for use in electrical and electronic equipment which includes a metallic housing having upper and lower openings through a stepped portion. A capacitor element is accommodated in the upper opening and includes a disk member with a central bore and electrodes provided on its opposite surfaces. A central conductor is inserted through the central bore of the disk member so as to be secured for being electrically connected to one of the electrodes, with the other of the electrodes being electrically connected to the stepped portion of the housing. Finally, an electrically insulating support plug extends through by the central conductor and is fixed to the lower opening, and resin material filled in the upper opening of the housing.

Again, Wakino is directed to a device for attenuation of RF range frequencies. Accordingly, Wakino fails to provide for a device which can handle high power at lower frequencies. The device in Wakino could never operate at the temperatures contemplated by the present invention.

None of the aforementioned patents is directed to providing a feed-through capacitor which is able to handle high power (power in excess of 1 ampere and, in the preferred embodiment, up to 700 amps) and to provide a direct shunt path for high frequencies. The aforementioned devices fail to contain structure necessary to alleviate thermal stress created during operation of a feed-through capacitor. Absent means for alleviating the thermal stress, the capacitive element in each of the above devices would shatter or otherwise become inoperable, rendering the feed-through capacitor useless.

The present invention is the first to address the Problem of providing a compact, lightweight feed-through capacitor which includes resilient structure necessary to overcome thermal stress to allow the feed-through capacitor to operate in a high power, high current, high temperature environment, the kind of environment encountered by variable speed constant frequency aircraft power generating systems.

DISCLOSURE OF INVENTION

It is therefore a primary object of this invention to provide, in a high current feed-through capacitor having a hollow conductive housing, a conductive feed-through stud within the housing and an annular capacitive element for conducting electrical energy, the capacitive element disposed therebetween, an electrical coupling comprising a first conductor disposed between an outer surface of the stud and an inner surface of the capacitive element, the first conductor providing an electrical path from the stud to the capacitive element for electrical energy present in the stud and a second conductor disposed between an outer surface of the capacitive element and an inner surface of the housing, the second conductor providing an electrical path for the electrical energy conducted by the capacitive element from the stud.

Another primary object of the invention is to Provide a high temperature, high current feed-through capacitor comprising a hollow conductive housing; a conductive stud within the housing having a current of one ampere or greater in the stud, the current including lower and higher frequencies, the stud providing a low impedance path therethrough for the lower frequencies; and an annular capacitive element disposed between the housing and the stud, the capacitive element providing a low impedance path for the higher frequencies to an electrically dissipative mechanism, whereby the higher frequencies are grounded, the stud rendered free of the higher frequencies. The capacitor further comprises resilient conductors suspending the capacitive element between the stud and the housing, the resilient conductors bearing resiliently against the capacitive element to: (a) suspend the capacitive element between the stud and the housing, thereby allowing the housing, the capacitive element and the stud to shift relative to one another as a temperature of the feed-through capacitor changes, the shifting rendering the capacitive element free of mechanical stress which would be placed on the capacitive element absent the resilient conductors, and (b) provide an electrical path for current from the stud to the housing via the capacitive element.

Another object of the invention is to provide a feed-through capacitor wherein a housing is coupled to an electrically dissipative mechanism, the electrically dissipative mechanism providing an electrical ground for electrical energy conducted by a capacitive element from a stud.

Still another object of the invention is to provide a feed-through capacitor wherein a capacitive element has a first electrode coating on an inner surface of the capacitive element and a second electrode coating on an outer surface of the capacitive element.

Yet another object of the invention is to provide a feed-through capacitor wherein first and second conductors are annular.

Still another object of the invention is to provide a feed-through capacitor wherein first and second conductors bear resiliently against first and second electrode coatings of a capacitive element, respectively, to suspend the capacitive element between a stud and a housing, thereby allowing the housing, the capacitive element and the stud to shift relative to one another as the temperature of the feed-through capacitor changes, whereby mechanical stress which would be placed on the capacitive element absent the first and second conductors is dissipated.

Still yet another object of the invention is to provide a feed-through capacitor wherein a stud has two remote ends, the ends adapted to receive electrical leads, the stud adapted to receive electrical current comprising lower and higher frequencies at one of the ends, the stud providing a low impedance path for the lower frequencies from the one to another of the ends, the capacitive element providing a low impedance path for the higher frequencies from the one of the ends to an electrically dissipative mechanism, whereby the higher frequencies are shunted to an electrical ground provided by the electrically dissipative mechanism, the other of the ends rendered free of the higher frequencies.

The final object of the invention is to provide a feed-through capacitor wherein an electrically dissipative mechanism is an electrical chassis.

In the attainment of the foregoing objects, the apparatus that encompasses the preferred embodiment of the invention includes a high temperature, high current feed-through capacitor comprising a hollow conductive housing and a conductive stud within the housing having a current of 100 amperes or greater in the stud, the current including lower and higher frequencies, the stud providing a low impedance path therethrough for the lower frequencies. The capacitor further comprises an annular capacitive element disposed between the housing and the stud, the capacitive element providing a low impedance path for higher frequencies to an electrically dissipative mechanism, whereby the higher frequencies are grounded, the stud rendered free of the higher frequencies and resilient conductors suspending the capacitive element between the housing and the stud, the resilient conductors bearing resiliently against the capacitive element to: (a) suspend the capacitive element between the stud and housing, thereby allowing the housing, the capacitive element and the stud to shift relative to one another as a temperature of the feed-through capacitor changes, the shifting rendering the capacitive element free of mechanical stress which would be placed on the capacitive element absent the resilient conductors, and (b) provide an electrical path for the higher frequencies from the stud to the housing via the capacitive element. The housing is coupled to an electrically dissipative mechanism, the electrically dissipative mechanism providing an electrical ground for the current conducted by the capacitive element from the stud. The electrically dissipative mechanism may be an electrical chassis. The feed-through capacitor passes through a bore in the chassis, the feed-through capacitor preventing the higher frequencies present on a side of the chassis from passing through to another side of the chassis.

The stud is adapted to carry a fundamental power component of 400 Hertz. The capacitive element is adapted to provide an electrical path for frequencies equalling or exceeding the 200th harmonic of the 400 Hertz fundamental component.

Figure 2:
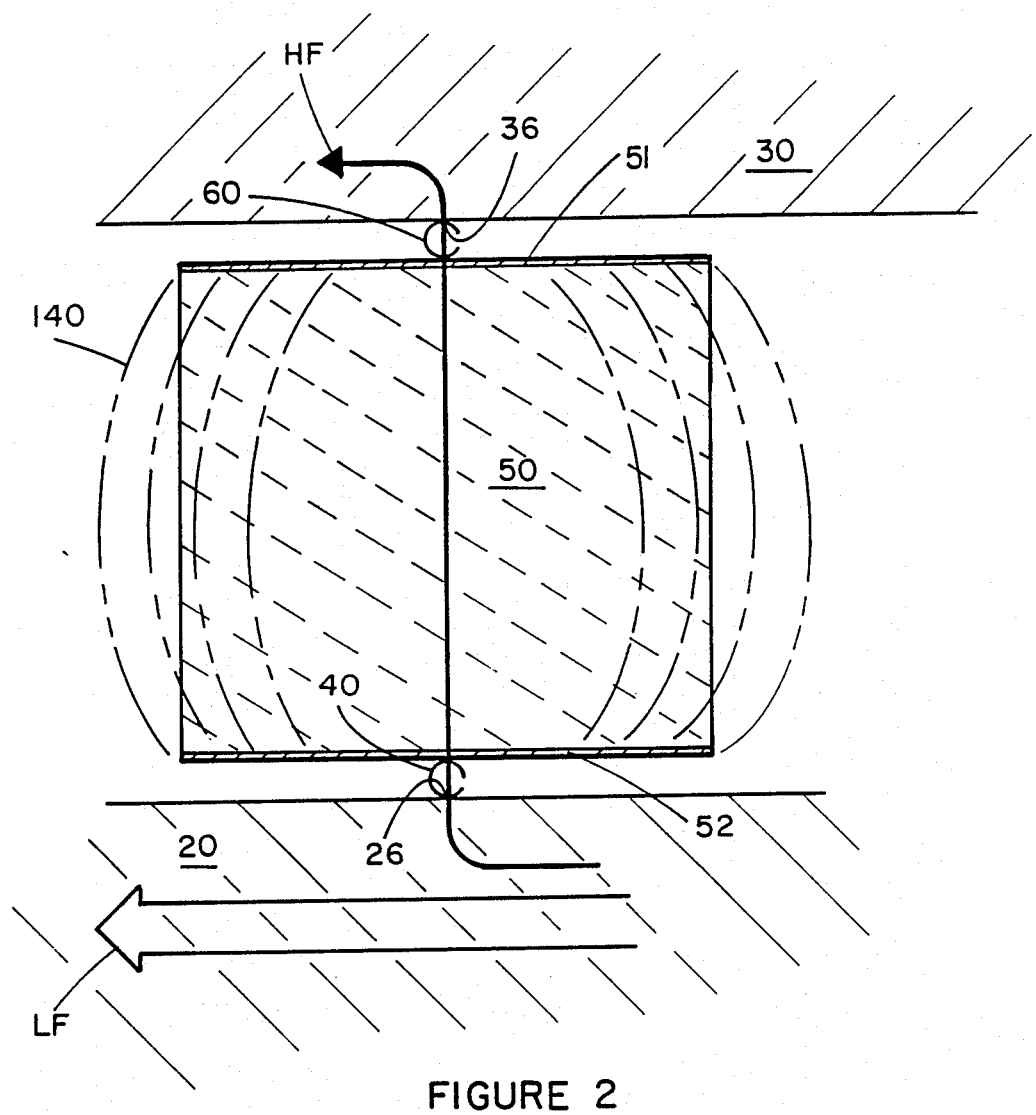

Other objects and advantages of the present invention will be apparent upon reference to the accompanying description when taken in conjunction with the following drawings:

FIG. 1 is a full section view of a high power feed-through capacitor embodying the invention; and FIG. 2 a partial section view of the capacitor of FIG. 1, showing the capacitive element and power paths in greater detail.

BEST MODE FOR CARRYING OUT INVENTION

FIG. 1 shows a full section view of a high power feed-through capacitor embodying the invention. The feed-through capacitor comprises a shaft or stud 20 which passes through a cylindrical housing 30. A capacitive element 50 is located therebetween having a first resilient conductive ring 40 between the capacitive element 50 and the shaft or stud 20 and a second resilient conductive ring 60 between capacitive element 50 and the housing 30. A cover 10 to be described hereinafter is used to seat the capacitive element 50 in place. A lock washer 70 and hex nut 80 are used to secure the housing to a chassis 100. An insulating washer 90 is placed at an end of the housing 30 about the shaft or stud 20 to insulate the housing 30 from an output lead 130.

The cover 10 is fitted with cover threads 11 on its outer diameter and has a cover inner surface 12 designed to frictionally engage the shaft or stud 20. In addition, the cover 10 has a cover outer surface 13 which is formed in a hexagonal shape in the preferred embodiment to allow the hexagonal shape to be guided by a tool to cause the cover 10 to be threaded into placed within the housing 30. Finally, the cover 10 is provided with a cover capacitor mating surface 14 which is designed to engage the capacitive element 50 to hold the capacitive element 50 in place. The cover 10 acts as an insulator between the shaft or stud 20 and the housing 30 and thus is constructed a dielectric material.

The shaft or stud 20 is a cylindrical conductor which is designed to receive electrical leads at either end. A first bore 21 is provided at one end of the stud to receive an input lead 120, shown schematically in FIG. 1. The first bore 21 is, provided with first bore threads 23 to receive the input lead 120 via a threaded bolt (not shown). Likewise, the shaft or stud 20 is provided at an opposite end with a second bore 22 having second bore threads 24 adapted to receive the output lead 130 bolted thereto by means not shown. Again, the output lead 130 is shown schematically. The shaft or stud 20 has a stud outer surface 25 which passes through the cover 10 and engages the cover inner surface 12 to hold the shaft or stud 20 in place. Finally, the shaft or stud 20 has a stud mating point 26, the point at which the shaft or stud 20 makes electrical contact with the capacitive element 50 via first resilient conductive ring 40.

The housing 30 is made of conductive material and has, as shown in cross-section, a stepped cylindrical housing in the preferred embodiment. The housing 30 is fitted with housing cover threads 31 on its inner diameter designed to engage the cover threads 11 of the cover 10, thereby holding the cover 10 securely in place. Further, the housing 30 is provided with a stepped portion 32 which defines a smaller diameter end to the left and a larger diameter end to the right of the housing 30 as FIG. 1 is viewed. The housing stepped portion 32 also defines a housing capacitor seating surface 33 on an inner surface of the housing 30. The housing capacitor seating surface 33 is designed to engage the capacitive element 50 in a compressive fashion. The housing 30 is further fitted with housing hex nut threads 35 about an outer diameter of the smaller diameter of the housing 30. The housing hex nut threads 35 are designed to engage the hex nut 80. Finally, the stepped portion 32 defines, on an outer surface of the housing 30, a housing mating surface 34 wherein the housing 30 is electrically coupled to a chassis or electrically dissipative mechanism 100.

The capacitive element 50 is annular and has a first electrode coating 51 on its inner diameter. The first electrode coating 51 is a conductive coating designed to introduce electrical energy into the capacitive element 50. The first electrode coating 51 is electrically coupled to the first resilient conductive ring 40 whereby electric power may be derived from the shaft or stud 20 at the stud mating point 26. Further, the capacitive element 50 is provided with a second electrode coating 52 on its outer diameter which makes electrical contact with the second resilient conductive ring 60, whereby the capacitive element may discharge electric current into the housing 30 at a housing mating point 36.

The feed-through capacitor is designed to pass current through a bore in the chassis or electrically dissipative mechanism 100. The feed-through capacitor is secured in place by a hex nut 80 bearing resiliently against a lock washer 70. The hex nut 80 is threaded to the housing hex nut threads 35 by means of hex nut threads 81 on the inner surface of the hex nut 80. The feed-through capacitor, having been mechanically coupled to the chassis or electrically dissipative mechanism 100, is thereby electrically coupled to the chassis or electrical dissipative mechanism 100 by means of contact of the housing seating surface 34 with a chassis seating surface 101 on a side of the chassis or electrically dissipative mechanism 100. The chassis or electrically dissipative mechanism 100 is coupled to a ground 102, shown schematically, which provides dissipation for any electrical signal present in the chassis or electrically dissipative mechanism 100.

Electromagnetic interference ("EMI") 110, represented in FIG. 1 by a series of broken arcuate lines, is present on a side of the chassis or electrically dissipative mechanism 100. The chassis or electrically dissipative mechanism 100 acts as an EMI shield to prevent the EMI 110 from crossing to the other side of the chassis or electrically dissipative mechanism 100.

FIG. 2 is a partial section view of the capacitor of FIG. 1, showing the capacitive element and power paths in greater detail. Elements corresponding to those shown in FIG. 1 are similarly referenced and will not be explained again.

FIG. 2 schematically shows an AC current passing from right to left in the stud 20 and having low frequency components (frequency from the 400 Hertz fundamental to the 200th harmonic of the fundamental, labeled "LF") and high frequency components (components above the 200th harmonic of the fundamental, labeled "HF"). As shown, the low frequency component "LF" tends toward the center of the stud 20. Conversley, the high frequency "HF" tends to collect at the outer surface of the stud 20. The tendency for high frequencies to flow near the outer surface of a conductor is known as "skin effect". The instant invention uses "skin effect" to advantange, employing the capacitive element 50 about the outer surface of the stud 20 to collect these high frequencies "HF" residing at the surface of the stud 20, dissipating them by grounding.

Accordingly, in FIG. 2, high frequencies "HF" are shown exiting the stud 20 at the stud mating point 26. High frequencies "HF" enter the first resilient conductive ring 40 and, via the first electrode coating 51, enter a capacitor electromagnetic field 140, shown as broken arcuate lines. The capacitor electromagnetic field 140 shown is not intended to represent the field produced by the particular capacitive element 50 used. Rather, the capacitor electromagnetic field 140 is meant to generically represent any electromagnetic field about a capacitor designed to produce capacitance. High frequencies "HF" cross the capacitive element 50 via the capacitor electromagnetic field 140 and travel to the housing 30 via the second electrode coating 52 and the second resilient conductive ring 60, as shown. Low frequencies "LF" perceive the capacitive element 50 to be an insulator. Accordingly, low frequencies "LF" are not redirected from the stud and continue therethrough.

A key feature of the present invention is that the path taken from the stud 20 to the housing 30 by the high frequencies "HF" has as few turns as possible. At such high frequencies and powers, turns in an electrical path produce reflections and, therefore, more harmonics. The present invention is designed to absolutely minimize turns in the high frequency "HF" electrical path to two, as shown. Electrode and conductive ring arrangements which produce a more tortuous high frequency "HF" path would be undesirable in a high power application.

From the foregoing description, it is apparent that the invention described provides a novel high current feed-through capacitor which provides for dissipation of high frequencies passing through a feed-through stud. The feed-through stud may conduct a low frequency component of AC current which is unattenuated by the capacitor. Accordingly, the present invention teaches a devices which acts as a filter for higher harmonics and electromagnetic interference present on the feed-through stud. Accordingly, the high current feed-through capacitor has hollow conductive housing means, a conductive feed-through stud within the housing means, an annular capacitive element for conducting electrical energy, the element disposed therebetween and an electrical coupling comprising first conductive means disposed between an outer surface of the stud and an inner surface of the capacitive element, the first conductive means providing an electrical path from the stud to the capacitive element for electrical energy present in the stud and second conductive means disposed radially between an outer surface of the capacitive element and a inner surface of the housing means, the second conductive means providing an electrical path for the electrical energy conducted by the capacitive element from the stud.

Although this invention has been illustrated and described in connection with the particular embodiments illustrated, it will be apparent to those skilled in the art that various changes may be made therein without departing from the spirit of the invention as set forth in the appended claims.

I claim:

1. In a high current feed-through capacitor having hollow conductive housing means, a conductive feed-through stud within said housing means and an annular capacitive element for conducting electrical energy, said element disposed therebetween an electrical coupling, comprising:

first conductive means disposed between an outer surface of said stud and an inner surface of said capacitive element, said first conductive means providing an electrical path from said stud to said capacitive element for electrical energy present in said stud; and second conductive means disposed radially between an outer surface of said capacitive element and an inner surface of said housing means, said second conductive means providing an electrical path for said electrical energy conducted by said capacitive element from said stud.

2. The feed-through capacitor as recited in claim 1 wherein said housing is coupled to electrically dissipative means, said electrically dissipative means providing an electrical ground for said electrical energy conducted by said capacitive element from said stud.

3. The feed-through capacitor as recited in claim 2 wherein said capacitive element has a first electrode coating on said inner surface of said capacitive element and a second electrode coating on said outer surface of said capacitive element.

4. The feed-through capacitor as recited in claim 3 wherein said first and second conductive means are annular.

5. The feed-through capacitor as recited in claim 4 wherein said first and second conductive means bear resiliently against said first and second electrode coatings, respectively, to suspend said capacitive element between said feed-through stud and said housing means, thereby allowing said housing means, said capacitive element and said stud to shift relative to one another as a temperature of said feed-through capacitor changes, whereby mechanical stress which would be placed on said capacitive element absent said first and second resilient conductive means is dissipated.

6. The feed-through capacitor as recited in claim 5 wherein said feed-through stud has two remote ends, said ends adapted to receive electrical leads, said feed-through stud adapted to receive electrical current comprising lower and higher frequencies at one of said ends, said feed-through stud providing a low impedance path for said lower frequencies from said one to another of said ends, said capacitor element providing a low impedance path for said higher frequencies from said one of said ends to said electrically dissipative means, whereby said higher frequencies are shunted to said electrical ground provided by said dissipative means, whereby said higher frequencies are shunted to said electrical ground provided by said dissipative means, said other of said ends rendered free of said higher frequencies.

7. The feed-through capacitor as recited in claim 6 wherein said electrically dissipative means is an electrical chassis.

8. In a high current feed-through capacitor having conductive housing means and an annular capacitive element for conducting electrical energy, said element disposed within said housing means, an electrical coupling, comprising:

a conductive feed-through stud disposed within said capacitive element, said stud having a first end and a second end;

first conductive means disposed radially between an outer surface of said feed-through stud and an inner surface of said capacitor element, said first conductive means providing an electrical path from said feed-through stud said capacitive element for electrical energy present in said feed-through stud; and second conductive means disposed between an outer surface of said capacitive element and an inner surface of said housing means, said second conductive means providing an electrical path for said electrical energy conducted by said capacitive element from said stud to said housing means, to thereby permit said stud to receive electrical current comprising lower and higher frequencies at said first end, said stud providing a low impedance for said lower frequencies from said first end to said second end, said capacitive element providing a low impedance path for said higher frequencies from said first end to electrically dissipated means via said housing means, whereby said higher frequencies are grounded and said second end is free of said higher frequencies.

9. The feed-through capacitor as recited in claim 8 wherein said electrically dissipated means provides an electrical ground for said higher frequencies conducted by said capacitive element from said feed-through stud.

10. The feed-through capacitor as recited in claim 9 wherein said capacitive element has a first electrode coating on said inner surface of said capacitive element and a second electrode coating on said outer surface of said capacitive element.

11. The feed-through capacitor as recited in claim 10 wherein said first and second conductive means are annular.

12. The feed-through capacitor as recited in claim 11 wherein said first and second conductive mean bear resiliently against said first and second electrode coatings to suspend said capacitive element between said stud and said housing means, thereby allowing said housing means, said capacitive element and said feed-through stud to shift relative to one another as a temperature of said feed-through capacitor changes, whereby mechanical stress which would be placed on said capacitive element absent said first and second resilient conductive means is dissipated.

13. The feed-through capacitor as recited in claim 12 wherein said first end and said second end are each adapted to receive electrical leads.

14. The feed-through capacitor as recited in claim 13 wherein said electrically dissipated means is an electrical chassis.

15. In a high current feed-through capacitor having hollow cylindrical conductive housing means having an inner surface, a conductive feed-through stud within said housing means having an outer surface and an annular capacitive element for conducting electrical energy, said element disposed therebetween having an inner surface and an outer surface, an electrical coupling, comprising:

first conductive means disposed between said outer surface of said stud and said inner surface of said capacitive element, said first conductive means providing an electrical path from said stud to said capacitive element for electrical energy present in said stud;

second conductive means disposed radially between said outer surface of said capacitive element and said inner surface of said housing means, said second conductive means providing an electrical path for said electrical energy conducted by said capacitive element from said stud to said housing means, said conductive means bearing resiliently against said capacitive element to suspend said capacitive element between said stud and said housing means, thereby allowing said housing means, said capacitive element and said stud to shift relative to one another as a temperature of the feed-through capacitor changes, whereby mechanical stress which would be placed on said capacitive element absent said resilient conductive means is dissipated;

a first electrode coating on said inner surface of said capacitive element; and a second electrode coating on said outer surface of said capacitive element.

16. The feed-through capacitor as recited in claim 15 wherein a first end of said stud is adapted to receive electrical current comprising lower and higher frequencies, said stud providing a low impedance path for said lower frequencies from said first end to a second end, said capacitive element providing a low impedance Path for said higher frequencies from said first end to electrically dissipative means coupled to said housing means, whereby said higher frequencies are delivered to said electrically dissipative means, said electrically dissipative means providing an electrical ground for said electrical energy conducted by said capacitive element from said stud.

17. The feed-through capacitor as recited in claim 16 wherein said second end is free of said higher frequencies.

18. The feed-through capacitor as recited in claim 17 wherein said electrically dissipative means is an electrical chassis.

19. The feed-through capacitor as recited in claim 18 wherein said first and second conductive means are annular.

20. The feed-through capacitor as recited in claim 19 wherein said feed-through capacitor passes through a bore in said chassis, said feed-through capacitor preventing said higher frequencies present on a side of chassis from passing through to another side of said chassis.

21. The feed-through capacitor as recited in claim 20 wherein said first and second ends are each adapted to receive electrical leads.

22. A high temperature, high current feed-through capacitor, comprising:

hollow conductive housing means;

a conductive stud within said housing means having a current of one ampere or greater in said stud, said current including lower and higher frequencies, said stud providing a low impedance path therethrough for said lower frequencies, said capacitive element providing a low impedance path for said higher frequencies are grounded, said stud rendered free of said higher frequencies;

an annular capacitive element disposed between said housing means and said stud; and resilient conductive means suspending said capacitive element between said stud and said housing, said resilient conductive means bearing resiliently against said capacitive element to (a) suspend said capacitive element between said stud said housing means, thereby allowing said capacitive element and said stud to shift relative to one another as a temperature of the feed-through capacitor changes, said shifting rendering said capacitive element free of mechanical stress which would be placed on the capacitive element absent said resilient conductive means, and (b) provide an electrical path for current from said stud to said housing via said capacitive element.

23. The feed-through capacitor as recited in claim wherein said capacitive element has a first electrode coating and a second electrode coating to thereby provide an electrical path from said capacitive element to said resilient conductive means.

24. The feed-through capacitor as recited in claim wherein said resilient conductive means are annular.

25. The feed-through capacitor as recited in claim wherein said housing means is coupled to electrically dissipative means, electrically dissipative means providing an electrical ground for said current conducted by said capacitive element from said stud.

26. The feed-through capacitor as recited in claim wherein said electrically dissipative means is an electrical chassis.

27. The feed-through capacitor as recited in claim wherein said feed-through capacitor passes through a bore in said chassis, said feed-through capacitor preventing said higher frequencies present on a side of chassis from passing through another side of said chassis.

28. The feed-through capacitor is recited in claim wherein said stud is adapted to receive electrical leads.

29. A high temperature, high current feed-through capacitor, comprising:

hollow conductive housing means;

A conductive stud within said housing means having a current of 100 amperes or greater in said stud, said current including a lower and higher frequencies, said stud providing a low impedance path therethrough for said lower frequencies, said capacitive element providing a low impedance path for said higher frequencies to electrically dissipative means, whereby said higher frequencies are grounded, said stud rendered free of said higher frequencies;

an annular capacitive element disposed between said housing means and said stud; and resilient conductive means suspending said capacitive element between said stud and said housing, said resilient conductive means bearing resiliently against said capacitive element to (a) suspend said capacitive element between said stud and said housing means, thereby allowing said housing means, said capacitive element and said stud to shift relative to one another as a temperature of the feed-through capacitor changes, said shifting rendering said capacitive element free of mechanical stress which would be placed on the capacitive element absent said resilient conductive means, and (b) provide an electrical path for current from said stud to said housing via said capacitive element.

30. The feed-through capacitor as recited in claim 29 wherein said housing means is coupled to electrically dissipative means, said electrically dissipative providing an electrical ground for said current conducted by said capacitive element from said stud.

31. The feed-through capacitor as recited in claim 30 wherein said electrically dissipative means is an electrical chassis.

32. The feed-through capacitor as recited in claim 31 wherein said feed-through capacitor passes through a bore in said chassis, said feed-through capacitor preventing said higher frequencies present on a side of said chassis from passing through to another side of said chassis.

33. The feed-through capacitor as recited in claim 32 wherein said stud is adapted to carry a fundamental power component of 400 Hertz.

34. The feed-through capacitor as recited in claim 33 wherein said capacitive element is adapted to provide an electrical path for frequencies exceeding the 200th harmonic of said 400 hertz fundamental frequencies.

* * * * *